(12) United States Patent
Morita et al.

(10) Patent No.: US 10,905,013 B2
(45) Date of Patent: Jan. 26, 2021

(54) PRINTED WIRING BOARD AND METHOD FOR MANUFACTURING THE SAME

(71) Applicant: TDK CORPORATION, Tokyo (JP)

(72) Inventors: Takaaki Morita, Tokyo (JP); Seiichi Tajima, Tokyo (JP); Takashi Kariya, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/422,248

(22) Filed: May 24, 2019

(65) Prior Publication Data

US 2019/0373739 A1    Dec. 5, 2019

(30) Foreign Application Priority Data

May 29, 2018    (JP) .................................. 2018-102155

(51) Int. Cl.
| | |
|---|---|
| *H05K 1/02* | (2006.01) |
| *H05K 3/46* | (2006.01) |
| *H05K 3/18* | (2006.01) |
| *H05K 3/00* | (2006.01) |
| *H05K 1/11* | (2006.01) |

(52) U.S. Cl.
CPC .......... *H05K 3/188* (2013.01); *H05K 1/0296* (2013.01); *H05K 1/115* (2013.01); *H05K 3/0014* (2013.01); *H05K 3/4617* (2013.01); *H05K 3/462* (2013.01); *H05K 2203/0723* (2013.01); *H05K 2203/1453* (2013.01)

(58) Field of Classification Search
CPC ........................... H05K 1/0296; H05K 3/4617
See application file for complete search history.

(56) References Cited

U.S. PATENT DOCUMENTS

| | | | | |
|---|---|---|---|---|
| 5,440,805 | A * | 8/1995 | Daigle ................ | H01L 21/4857 174/262 |
| 7,060,604 | B2 * | 6/2006 | Kata ................... | H01L 21/4857 257/701 |
| 2013/0062101 | A1 | 3/2013 | Kanai et al. | |
| 2017/0130009 | A1 * | 5/2017 | Hosoda ................ | B32B 27/18 |

FOREIGN PATENT DOCUMENTS

WO    2011/155162 A1    12/2011

* cited by examiner

*Primary Examiner* — Jeremy C Norris
(74) *Attorney, Agent, or Firm* — Oliff PLC

(57) ABSTRACT

In a wiring base body of a printed wiring board, a conductive post including a wiring portion and a wiring are embedded in an insulating resin film. Therefore, even in a region in which a wiring portion is formed, the wiring base body is not increased in thickness. In addition, even in a region in which a wiring is formed, the wiring base body is not increased in thickness. Therefore, it is possible to obtain a printed wiring board having high flatness by stacking a plurality of wiring base bodies and constituting a printed wiring board.

6 Claims, 5 Drawing Sheets

PRINTED WIRING BOARD AND METHOD FOR MANUFACTURING THE SAME

CROSS-REFERENCE TO RELATED APPLICATIONS

This application is based upon and claims the benefit of priority from Japanese Patent Application No. 2018-102155, filed on 29 May, 2018, the entire contents of which are incorporated herein by reference.

TECHNICAL FIELD

The present disclosure relates to a printed wiring board and a method for manufacturing the same.

BACKGROUND

In the related art, printed wiring boards having a multilayer structure, in which a plurality of wiring base bodies are stacked, are known. For example, PCT International Publication No.

WO2011/155162 (Patent Literature 1) discloses a configuration in which a wiring formed on a main surface of each of wiring base bodies is connected through a conductive post extending in a thickness direction of the base bodies.

SUMMARY

In printed wiring boards according to the technology in the related art described above, a region, in which a wiring is formed, is locally increased in thickness. Therefore, when a printed wiring board is constituted by stacking a plurality of wiring base bodies using a technique such as random stacking or collective stacking, unevenness is likely to be generated on the front surface of the printed wiring board, so that it is difficult to achieve high flatness.

According the present disclosure, a printed wiring board improved in flatness and a method for manufacturing the same are provided.

According to an embodiment of the present disclosure, there is provided a printed wiring board including at least one layer of a wiring base body including an insulating resin film having a first main surface and a second main surface; a conductive post embedded in the insulating resin film, the conductive post penetrating the insulating resin film from the first main surface to the second main surface, and the conductive post having a wiring portion exposed to the second main surface and a main body portion extending from the wiring portion to the first main surface; and a wiring embedded in the insulating resin film, the wiring extending in a direction parallel to the second main surface, and the wiring exposed to the second main surface.

In the printed wiring board, the wiring and the conductive post including the wiring portion of the wiring base body are embedded in the insulating resin film. Therefore, an increase in thickness of a region, in which the wiring and the wiring portion are formed, is curbed.

The printed wiring board according to the embodiment may further include a frame body surrounding the insulating resin film when viewed in a thickness direction of the insulating resin film and the frame body having the same height as a height of the conductive post.

In the printed wiring board according to the embodiment, the wiring portion and the main body portion of the conductive post may be constituted as separate bodies.

In the printed wiring board according to the embodiment, the wiring portion and the main body portion of the conductive post may be constituted through plating.

According to another embodiment of the present disclosure, there is provided a method for manufacturing a printed wiring board including at least one layer of a wiring base body including an insulating resin film having a first main surface and a second main surface; a conductive post embedded in the insulating resin film, the conductive post penetrating the insulating resin film from the first main surface to the second main surface, and the conductive post having a wiring portion exposed to the second main surface and a main body portion extending from the wiring portion to the first main surface; and a wiring embedded in the insulating resin film, the wiring extending in a direction parallel to the second main surface, and the wiring exposed to the second main surface. The method for manufacturing a printed wiring board includes the steps of forming the conductive post and the wiring on one surface of a support plate, forming the insulating resin film integrally covering the conductive post and the wiring provided on the one surface of the support plate, and removing the support plate from the insulating resin film.

According to the method for manufacturing a printed wiring board, it is possible to obtain a printed wiring board in which the wiring and the conductive post including the wiring portion are embedded in the insulating resin film of the wiring base body. According to this printed wiring board, an increase in thickness of a region, in which the wiring and the wiring portion are formed, is curbed.

In the method for manufacturing a printed wiring board according to the embodiment, the insulating resin film may be formed by performing hot pressing of a resin powder in the step of forming the insulating resin film.

In the method for manufacturing a printed wiring board according to the embodiment, the step of forming the insulating resin film may include a step of forming a frame body surrounding the conductive post and the wiring integrally on the one surface of the support plate and the frame body having the same height as a height of the conductive post, and a step of performing hot pressing of the resin powder supplied to the inside of the frame body.

In the method for manufacturing a printed wiring board according to the embodiment, the step of forming the conductive post may include a step of forming the wiring portion on the one surface of the support plate, and a step of forming the main body portion on the wiring portion.

In the method for manufacturing a printed wiring board according to the embodiment, the wiring portion and the main body portion may be formed through plating.

DETAILED DESCRIPTION

Hereinafter, various embodiments will be described in detail with reference to the drawings. The same reference signs are applied to parts which are the same or corresponding in each of the drawings, and duplicated description will be omitted.

Figure 1:
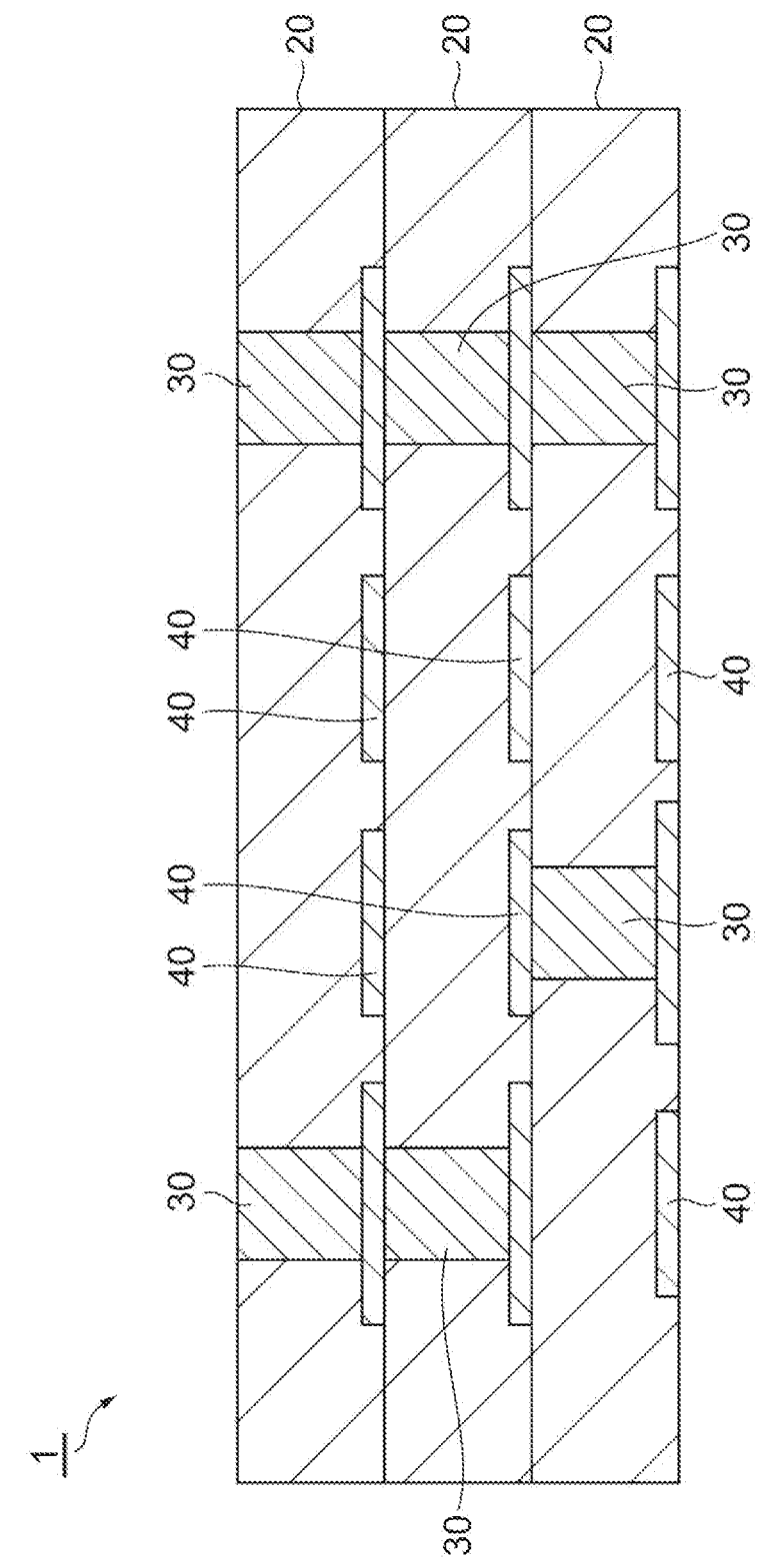
FIG. 1 is a schematic cross-sectional view illustrating a printed wiring board according to an embodiment of the present disclosure.

As illustrated in FIG. 1, a printed wiring board 1 according to the embodiment has a configuration in which a plurality of wiring base bodies 20 are stacked. In the present embodiment, the printed wiring board 1 including three wiring base bodies 20 will be described.

Figure 2:
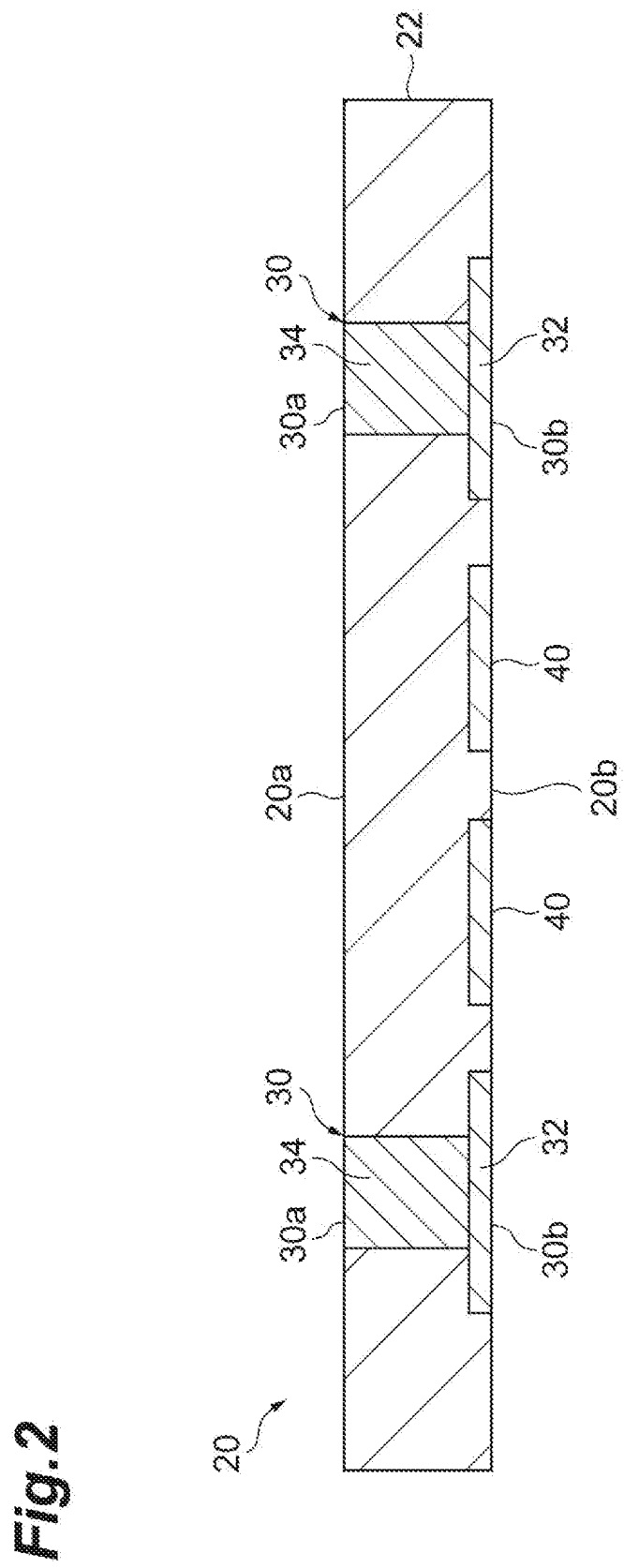
FIG. 2 is a schematic cross-sectional view illustrating a wiring base body illustrated in FIG. 1.

As illustrated in FIGS. 1 and 2, the wiring base body 20 has a thin film-like outer shape with a substantially uniform thickness. The wiring base body 20 includes an insulating resin film 22, and a conductive post 30 and a wiring 40 which are embedded in the insulating resin film 22.

The insulating resin film 22 is a thin film-like member having an upper surface 20a (first main surface) and a lower surface 20b (second main surface). The insulating resin film 22 can be formed of a thermoplastic resin. In the present embodiment, the insulating resin film 22 is formed of a liquid crystal polymer (LCP). Various insulating resin materials can be employed as a constituent material of the insulating resin film 22. From the viewpoint of high frequency characteristics, thermal resistance, low water absorption characteristics, and the like, a liquid crystal polymer can be employed.

The conductive post 30 is formed of a conductive material. In the present embodiment, the conductive post 30 is formed of Cu. The conductive post 30 extends in a thickness direction of the wiring base body 20, penetrates the wiring base body 20, and includes a wiring portion 32 and a main body portion 34 constituted as separate bodies. The height of the conductive post 30 (length in the thickness direction of the wiring base body 20) is within a range of approximately 30 to 100 μm and is 50 μm, for example.

The wiring portion 32 is a flat plate-like thin piece part extending while being parallel to the lower surface 20b of the insulating resin film 22. The wiring portion 32 has a substantially uniform thickness. The thickness of the wiring portion 32 is 10 μm, for example. The lower surface of the wiring portion 32 constitutes a lower surface 30b of the conductive post 30, and the lower surface 30b of the conductive post 30 is parallel to and flush with the lower surface 20b of the wiring base body 20. The upper surface of the wiring portion 32 extends while being parallel to the lower surface 30b of the conductive post 30 and the lower surface 20b of the wiring base body 20.

The main body portion 34 is a columnar part extending upward from the wiring portion 32 to the upper surface 20a. In the present embodiment, the main body portion 34 has a shape with a circular cross section orthogonal to an extending direction thereof (that is, the thickness direction of the wiring base body 20). The main body portion 34 is designed to have a uniform diameter in the extending direction of the main body portion 34. The upper surface of the main body portion 34 constitutes an upper surface 30a of the conductive post 30. The upper surface 30a of the conductive post 30 is parallel to and flush with the upper surface 20a of the wiring base body 20.

The wiring 40 is formed of the same conductive material as the conductive post 30. In the present embodiment, the wiring 40 is formed of Cu. The wiring 40 has a substantially rectangular cross section. The wiring 40 is formed on the lower surface 20b side of the wiring base body 20 but is not formed on the upper surface 20a side. The wiring 40 extends while being parallel to the lower surface 20b of the insulating resin film 22 and is exposed to the lower surface 20b. The lower surface of the wiring 40 is parallel to and flush with the lower surface 20b of the wiring base body 20. The upper surface of the wiring 40 extends while being parallel to the lower surface of the wiring 40 and the lower surface 20b of the wiring base body 20. The wiring 40 has a substantially uniform thickness. The thickness of the wiring 40 is the same as the thickness of the wiring portion 32 of the conductive post 30 and is 10 μm, for example. The wiring 40 forms a part of a circuit of the wiring base body 20 on the lower surface 20b side.

Subsequently, a method for manufacturing the foregoing printed wiring board 1 will be described with reference to FIGS. 3A to 3D and 4A to 4C.

Figure 3A:
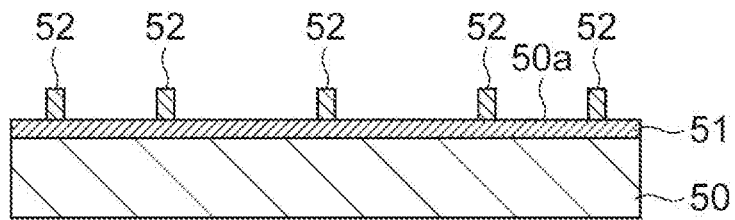
FIGS. 3A to 3D are views illustrating steps of a method for manufacturing the printed wiring board illustrated in FIG. 1.

In order to manufacture the printed wiring board 1, there is a need to manufacture the wiring base body 20. When the wiring base body 20 is manufactured, first, as illustrated in FIG. 3A, a support plate 50 in which a conducting film 51 is provided on one main surface 50a side is prepared. The support plate 50 has a flat plate shape. The support plate 50 can be formed of a prepreg material, a glass, or a silicon, for example. The conducting film 51 is a film functioning as a plating seed and can be formed of a metal such as Cu, for example. The conducting film 51 may be a metal film deposited through sputtering or the like or may be a metal foil such as a Cu foil. Alternatively, an ultrathin copper foil with a carrier or the like may be used to serve as both a part of the support plate 50 and the conducting film 51. Then, the conductive post 30 and the wiring 40 described above are formed on the main surface 50a of the support plate 50. Specifically, alongside the steps illustrated in FIGS. 3A to 3D, the conductive post 30 and the wiring 40 are plated on the main surface 50a of the support plate 50.

In the step illustrated in FIG. 3A, a resist 52 is patterned on the main surface 50a of the support plate 50. The resist 52 has openings in a region of the wiring portion 32 of the conductive post 30 described above and a region of the wiring 40.

Figure 3B:
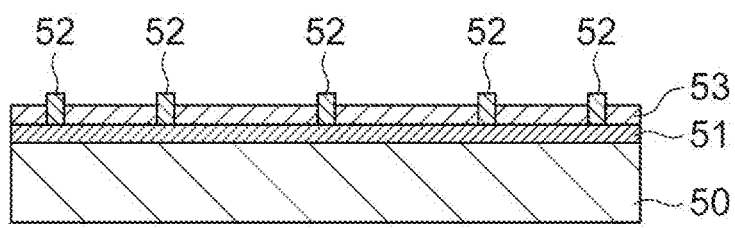

In the step illustrated in FIG. 3B, the resist 52 is used for forming a first plated layer 53 through electroplating of Cu, in which the conducting film 51 serves as a seed. Thereafter, in the step illustrated in FIG. 3C, the resist 52 is removed. The first plated layer 53 becomes the wiring portion 32 of the conductive post 30 and the wiring 40.

Figure 3C:
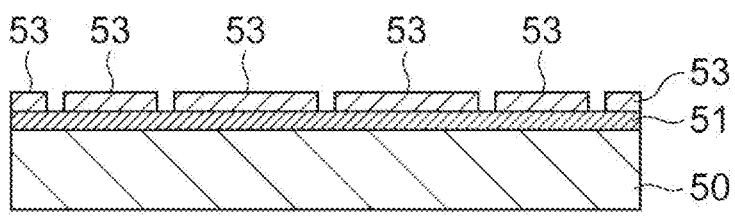
Figure 3D:
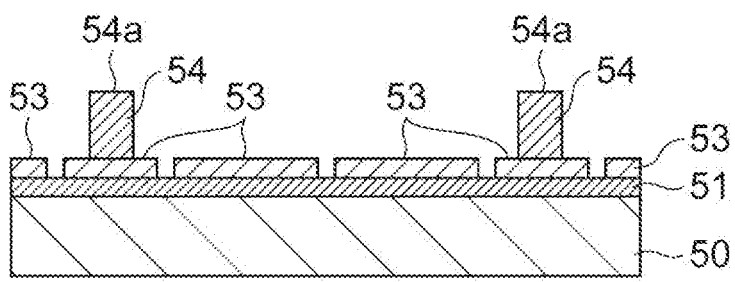

In the step illustrated in FIG. 3D, a second plated layer 54 is formed through electroplating of Cu in steps similar to the steps illustrated in FIGS. 3A to 3C (that is, resist patterning, electroplating, and resist removing). The present embodiment illustrates a procedure in which the resist 52 is removed after the first plated layer 53 is formed and before the second plated layer 54 is formed. However, the resist 52 may be removed at the same time when removing a resist used when the second plated layer 54 is formed. The second plated layer 54 is selectively formed on only the first plated layer 53 which becomes the wiring portion 32 of the conductive post 30. The second plated layer 54 becomes the main body portion 34 of the conductive post 30. After the second plated layer 54 is formed, a layer (a Cr layer, a Ti layer, or the like) for preventing oxidation of Cu can be formed on the front surfaces of the first plated layer 53 and the second plated layer 54, particularly on a top surface 54a of the second plated layer 54.

Subsequently, the insulating resin film 22 integrally covering the conductive post 30 and the wiring 40 provided on the main surface 50a of the support plate 50 is formed. Specifically, alongside the steps illustrated in FIGS. 4A to 4C, the insulating resin film 22 is formed.

Figure 4A:
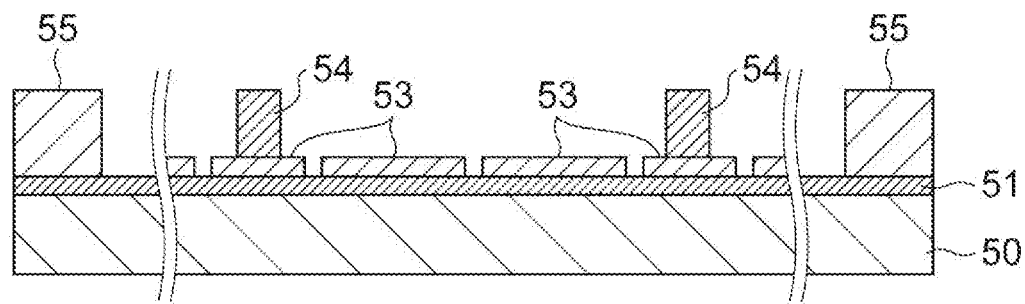
FIGS. 4A to 4C are other views illustrating steps of the method for manufacturing the printed wiring board illustrated in FIG. 1.

In the step illustrated in FIG. 4A, a frame 55 (frame body) surrounding a region, in which the insulating resin film 22 is formed, is provided on the main surface 50a of the support plate 50 before the insulating resin film 22 is formed. The frame 55 is provided in a manner of integrally surrounding the conductive post 30 and the wiring 40 when viewed in the thickness direction of the support plate 50. In the present embodiment, the frame 55 has the same height as the height of the conductive post 30. For example, in the steps of forming the first plated layer 53 and the second plated layer 54, the frame 55 constituted through plating can be formed on the main surface 50a of the support plate 50 by patterning a resist having an opening corresponding to the shape of the frame 55. In addition, a separately prepared member may be disposed as the frame 55 on the main surface 50a of the support plate 50. In the step of forming the insulating resin film 22, the frame 55 can curb the material of the insulating resin film 22 flowing out of the region and can prevent excessive pressing which may cause a situation of being thinner than a desired thickness. Therefore, the frame 55 is useful for controlling the thickness of the insulating resin film 22. When the frame 55 is formed through plating in the procedure described above, the height position of the upper surface of the second plated layer 54 and the height position of the upper surface of the frame 55 easily coincide with each other. Therefore, the frame 55 is more useful for controlling the thickness of the insulating resin film 22.

Figure 4B:
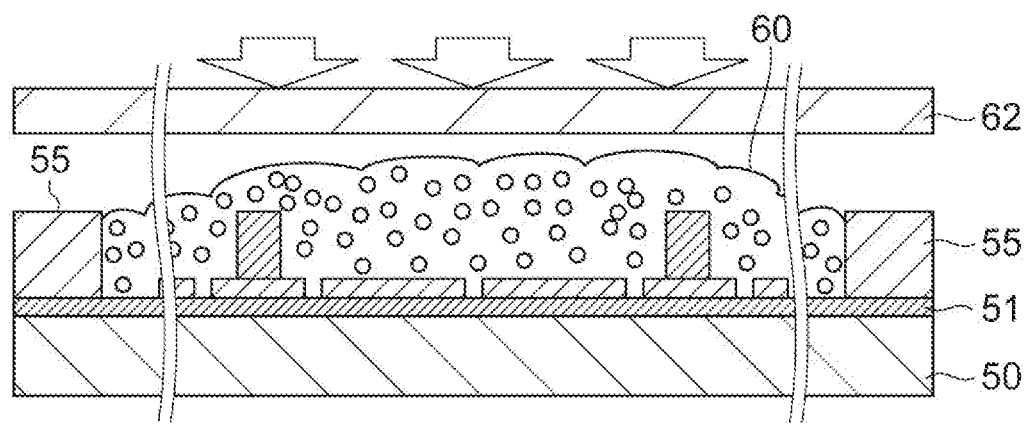

In the step illustrated in FIG. 4B, a resin powder 60 which will become the insulating resin film 22 is supplied to the inside of the frame 55 on the main surface 50a of the support plate 50, and a region surrounded by the frame 55 is covered with the resin powder 60. In this case, the first plated layer 53 and the second plated layer 54 formed on the main surface 50a are also covered with the resin powder 60. Then, the support plate 50 is subjected to hot pressing from the main surface 50a side using a hot plate 62 and is cooled thereafter. In order to stack the resin powder 60 through collective stacking, the resin powder 60 can be formed of a thermoplastic resin. In order to form the flat insulating resin film 22 on the main surface 50a of the support plate 50 which is uneven due to the first plated layer 53 and the second plated layer 54, the resin powder 60 can be in a form of a fine powder having a perfectly spherical shape. Compared to a case of using a resin in a form of a film or pellets, when supplying a resin before hot pressing, a necessary amount of a resin can be supplied to necessary places thoroughly on the main surface 50a having unevenness by using the resin powder 60 having a perfectly spherical shape. In addition, according to the form of the resin powder 60, a plurality of kinds of powder differing in characteristics can be selectively disposed at necessary places on the main surface 50a. Therefore, a plurality of insulating resin films 22 having different physical property values can be formed within the surface.

Figure 4C:
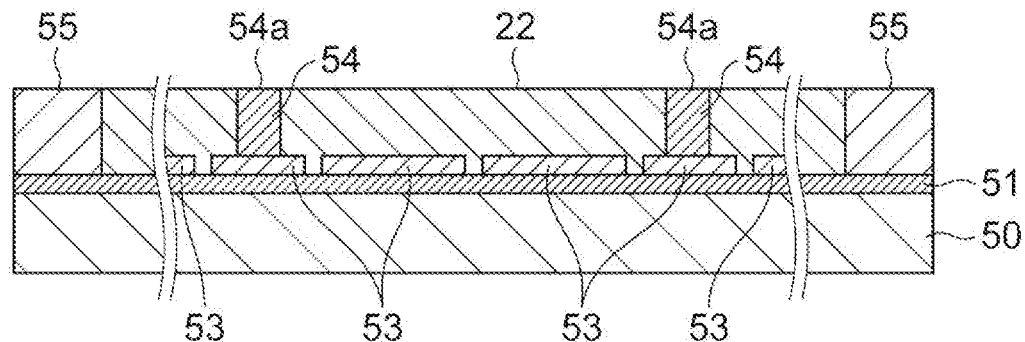

As a result, as illustrated in FIG. 4C, the main surface 50a of the support plate 50 is covered with the insulating resin film 22 inside the frame 55. In this case, the top surface 54a of the second plated layer 54 is exposed to the insulating resin film 22. When a resin film is formed on the top surface 54a of the second plated layer 54 after hot pressing, polishing processing such as CMP, grindstone polishing, or fly cutting may be performed in order to expose the top surface 54a of the second plated layer 54 to the insulating resin film 22.

Then, lastly, the support plate 50 is removed from the insulating resin film 22 together with the conducting film 51, thereby obtaining the wiring base body 20 illustrated in FIG. 2. An arbitrary technique such as a technique using a heat-peeling adhesive, peeling using a laser, a known technology of etching, or polishing processing such as grindstone polishing can be utilized to remove the conducting film 51 and the support plate 50.

The wiring base body 20 may be in a form excluding the frame 55 used when the insulating resin film 22 is formed or may be in a form including the frame 55. In the case in which the wiring base body 20 includes the frame 55, the frame 55 can surround the insulating resin film 22 when seen in the thickness direction of the insulating resin film 22 and can have the same height as the height of the conductive post 30.

A plurality of wiring base bodies 20 produced as described above are collectively stacked through hot pressing in a state in which the plurality of wiring base bodies 20 are stacked, thereby obtaining the printed wiring board 1 described above. When the wiring base bodies 20 are stacked, a conductive layer for connection formed of Au, Sn, Ag, a solder, or the like may be formed on one or both the upper surface 30a and the lower surface 30b of the conductive post 30.

As described above, in the wiring base body 20 of the printed wiring board 1, the conductive post 30 including the wiring portion 32 and the wiring 40 are embedded in the insulating resin film 22. Therefore, even in a region in which the wiring portion 32 is formed, the wiring base body 20 is not increased in thickness. In addition, even in a region in which the wiring 40 is formed, the wiring base body 20 is not increased in thickness. Therefore, it is possible to obtain the printed wiring board 1 having high flatness by constituting the printed wiring board 1 by stacking a plurality of wiring base bodies 20.

Figure 5:
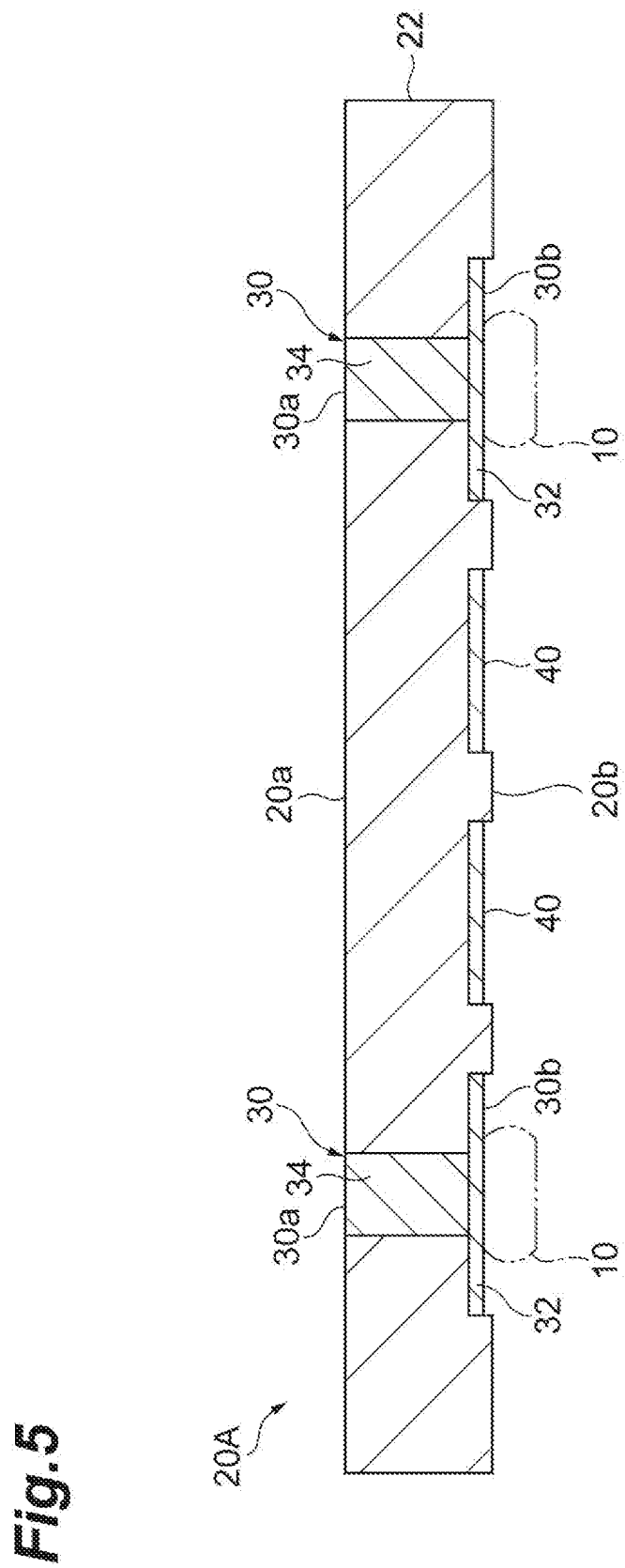
FIG. 5 is a schematic cross-sectional view illustrating a wiring base body in a different form.

The shape of the wiring base body 20 is not limited to that described above and can have a shape as illustrated in FIG. 5, for example. A wiring base body 20A illustrated in FIG. 5 differs from the wiring base body 20 described above in regard to only that the lower surface 30b of the conductive post 30 (that is, a lower end surface of the wiring portion 32) exposed to the lower surface 20b of the insulating resin film 22 is retracted from the lower surface 20b. For example, the configuration of the wiring base body 20A can be obtained by performing over-etching when the conducting film 51 and the support plate 50 are removed through etching after the step illustrated in FIG. 4C. In the case in which the lower surface 30b of the conductive post 30 is retracted from the lower surface 20b of the insulating resin film 22, when the plurality of wiring base bodies 20 are stacked with a connection portion 10 formed therebetween on the lower surface 30b of the conductive post 30, the connection portion 10 enters a part of the wiring portion 32 which is retracted from the lower surface 20b. As a result, an increase in thickness of a region, in which the connection portion 10 is formed, is curbed, so that the printed wiring board 1 can be further improved in flatness. The connection portion 10 can be formed of a solder, a conductive paste, or a metal nano filler, for example.

Hereinabove, the embodiment of the present disclosure has been described. The present disclosure is not limited to the foregoing embodiment, and various changes can be made. For example, the number of wiring base bodies constituting a printed wiring board is not limited to three layers and the number can be suitably increased and decreased. In addition, the constituent material for a wiring portion of a conductive post and the constituent material for a main body portion may be the same materials or may be different materials.

What is claimed is:

1. A printed wiring board comprising:
   at least two layers of a wiring base body, each of the at least two layers including:
   an insulating resin film having a first main surface and a second main surface;
   a conductive post embedded in the insulating resin film, the conductive post penetrating the insulating resin film from the first main surface to the second main surface, and the conductive post having a wiring portion exposed to the second main surface and a main body portion extending from the wiring portion to the first main surface;
   a frame body surrounding a periphery of the insulating resin film when viewed in a thickness direction of the insulating resin film and the frame body having the same height as a height of the conductive post; and
   a wiring embedded in the insulating resin film, the wiring extending in a direction parallel to the second main surface, and the wiring exposed to the second main surface, wherein:
   the each of the at least two layers is formed separately from all other of the at least two layers; and
   all of the at least two layers are stacked to form the printed wiring board after the each of the at least two layers has been separately formed.

2. The printed wiring board according to claim 1, wherein the wiring portion and the main body portion of the conductive post are constituted as separate bodies.

3. The printed wiring board according to claim 2, wherein the wiring portion and the main body portion of the conductive post are constituted through plating.

4. A method for manufacturing a printed wiring board including at least two layers of a wiring base body, each of the at least two layers including an insulating resin film having a first main surface and a second main surface; a conductive post embedded in the insulating resin film, the conductive post penetrating the insulating resin film from the first main surface to the second main surface, and the conductive post having a wiring portion exposed to the second main surface and a main body portion extending from the wiring portion to the first main surface; and a wiring embedded in the insulating resin film, the wiring extending in a direction parallel to the second main surface, and the wiring exposed to the second main surface, the method comprising the steps of:
   forming the conductive post and the wiring of the each of the at least two layers separately from forming the conductive post and wiring of all other of the at least two layers;
   forming the insulating resin film by a step of forming a frame body surrounding the conductive post and the wiring integrally on the one surface of the support plate and the frame body having the same height as a height of the conductive post, and a step of performing hot pressing of a resin powder supplied to the inside of the frame body;
   forming the insulating resin film integrally covering the conductive post and the wiring of the each of the at least two layers separately from forming the insulating resin film integrally covering the conductive post and the wiring of the all other of the at least two layers; and
   stacking the at least two layers.

5. The method for manufacturing a printed wiring board according to claim 4,
   wherein the step of forming the conductive post includes a step of forming the wiring portion on a surface of a support plate, and a step of forming the main body portion on the wiring portion.

6. The method for manufacturing a printed wiring board according to claim 5,
   wherein the wiring portion and the main body portion are formed through plating.

* * * * *